(12) United States Patent
Samejima et al.

(10) Patent No.: US 7,573,271 B2
(45) Date of Patent: Aug. 11, 2009

(54) APPARATUS FOR MEASURING ELECTRIC CHARACTERISTICS OF SEMICONDUCTOR

(75) Inventors: Toshiyuki Samejima, Tokyo (JP); Hajime Watakabe, Tokyo (JP)

(73) Assignee: National University Corporation Tokyo University of Agriculture and Technology, Tokyo (JP)

( * ) Notice: Subject to any disclaimer, the term of this patent is extended or adjusted under 35 U.S.C. 154(b) by 112 days.

(21) Appl. No.: 11/661,219

(22) PCT Filed: Aug. 25, 2005

(86) PCT No.: PCT/JP2005/015953

§ 371 (c)(1),
(2), (4) Date: May 25, 2007

(87) PCT Pub. No.: WO2006/022425

PCT Pub. Date: Mar. 2, 2006

(65) Prior Publication Data

US 2008/0018323 A1    Jan. 24, 2008

(30) Foreign Application Priority Data

Aug. 27, 2004   (JP)   ............... 2004-249197

(51) Int. Cl.
*G01R 31/00* (2006.01)
*G01R 31/302* (2006.01)
(52) U.S. Cl. ...................... 324/501; 324/752
(58) Field of Classification Search .............. 324/158.1, 324/501, 750–752, 760, 765
See application file for complete search history.

(56) References Cited

U.S. PATENT DOCUMENTS 4,494,069 A * 1/1985 Lin ............................ 324/752

(Continued)

FOREIGN PATENT DOCUMENTS

AU           199891285           9/1998

(Continued)

OTHER PUBLICATIONS

Briggs, R. The Analyst, Jul. 1963, vol. 88, No. 1048, pp. 491-493.*

(Continued)

*Primary Examiner*—Ha Tran T Nguyen
*Assistant Examiner*—Joshua Benitez
(74) *Attorney, Agent, or Firm*—Frommer Lawrence & Haug LLP; William S. Frommer

(57) ABSTRACT

An apparatus for measuring electric characteristics of a semiconductor includes a light irradiating means for irradiating light to a characteristic measured semiconductor, an alternating-current voltage source, an electric potential measuring means and an impedance regulator wherein impedance is regulated by an impedance regulator in such a manner that electric potential at an electric potential measuring point of the characteristic measured semiconductor may become zero electric potential in the state in which light is not irradiated on the characteristic measured semiconductor by the light irradiating means. Electric characteristics of the characteristic measured semiconductor are measured based on measurement of electric potential obtained with or without irradiation of light onto the characteristic measured semiconductor. With this arrangement, semiconductor electric characteristics can be measured with high accuracy by a simple arrangement.

4 Claims, 6 Drawing Sheets

U.S. PATENT DOCUMENTS

| | | | | |
|---|---|---|---|---|
| 4,510,675 | A | * | 4/1985 | Izu et al. ................. 204/224 R |
| 4,599,558 | A | * | 7/1986 | Castellano et al. .......... 324/752 |
| 4,891,582 | A | * | 1/1990 | Weiser et al. .............. 324/765 |
| 5,320,723 | A | * | 6/1994 | Kawakami .................. 205/656 |
| 5,929,652 | A | | 7/1999 | Ahrenkiel |
| 6,275,060 | B1 | | 8/2001 | Ahrenkiel et al. |
| 6,946,858 | B2 | * | 9/2005 | Matsuyama ................. 324/752 |
| 7,309,850 | B2 | * | 12/2007 | Sinton et al. ............. 250/203.4 |
| 7,411,408 | B2 | * | 8/2008 | Shimotomai et al. ........ 324/752 |
| 2002/0163323 | A1 | * | 11/2002 | Kasai et al. ................ 323/284 |

FOREIGN PATENT DOCUMENTS

| | | |
|---|---|---|
| AU | 739451 | 10/2001 |
| CA | 2 302 304 | 3/1999 |
| EP | 1010012 | 6/2000 |
| JP | 2003 517712 | 5/2003 |
| WO | WO 99 12045 | 3/1999 |

OTHER PUBLICATIONS

Hajimu Watakabe et al., Extended Abstracts (The 51$^{st}$ Spring Meeting, 2004); The Japan Society of Applied Physics and Related Societies. vol. 2, Mar. 28, 2004, p. 867.

* cited by examiner

APPARATUS FOR MEASURING ELECTRIC CHARACTERISTICS OF SEMICONDUCTOR

TECHNICAL FIELD

The present invention relates to an apparatus for measuring electric characteristics of a semiconductor suitable for use in measuring a carrier conduction mechanism within a semiconductor.

BACKGROUND ART

Semiconductor materials are widely used for the application to electronic devices such as transistors and solar cells. To evaluate carrier conduction in this semiconductor and electric characteristics of the surface state is important in manufacturing semiconductor devices having target characteristics with excellent yield.

It has been customary that an insulating film, for example, a surface protecting insulating film, a gate insulating film, a field insulating film and the like are formed on the surface of semiconductor. Interface state density between semiconductor and this insulating film considerably affects electric characteristics of semiconductor, accordingly, electric characteristics of semiconductor device and its evaluation is important.

Therefore, when characteristics of semiconductor are measured, it is not desirable that electrodes for measuring electric characteristics should be formed on the semiconductor in the state in which the insulating film was removed from the surface of the semiconductor because this method is not able to accurately measure electric characteristics of the semiconductor.

As methods for evaluating electric characteristics of semiconductor, an evaluation method based on capacity-voltage characteristic measurement using a metal/insulator/semiconductor structure has been used widely. According to this evaluation method, a bias voltage is applied to the above-described metal side, a small modulation high-frequency voltage is superimposed upon the applied bias voltage and a bias voltage and capacity characteristic based on the change of a depletion layer generated within a measured semiconductor is calculated. Then, quantity of electric charges in the insulating film and interface state density between the insulating film and the semiconductor are calculated from this voltage-capacity characteristic.

However, this measuring method encounters with a problem in accurately measuring semiconductor characteristics from the changes of this voltage-capacity characteristics because it has been customary that a semiconductor should have a thickness of greater than 10 µm in order to form depletion layers and that the change of the depletion layer is small in thin film semiconductors.

Also, other measuring method has been described in Japanese Published Patent Application No. 4-282846 in which attenuation of excess minority carriers induced within the semiconductor when pulse light is irradiated to the semiconductor, that is, life time is evaluated from the change of reflectance of light in the microwave band, thereby to examine a carrier conduction mechanism within the semiconductor.

However, in this case, in actual practice, it was difficult to directly evaluate the change of carrier concentration from the change of reflectance of light in the microwave band. Further, since a microwave generating power supply, a waveguide for guiding microwaves and the like are required, a problem arises, in which a measuring apparatus becomes complex in arrangement.

DISCLOSURE OF THE INVENTION

An object of the present invention is to provide an apparatus for measuring electric characteristics of a semiconductor in which the above-mentioned problems can be solved and in which electric characteristics of a semiconductor can be measured by a simple arrangement with high accuracy. Also, it is another object of the present invention to realize an apparatus for measuring electric characteristics of a semiconductor in which light-induced electric conduction can be measured and evaluated with high accuracy without removing an insulating film even when the insulating film is formed on the surface of a semiconductor in a semiconductor to be measured (hereinafter referred to as a "characteristic measured semiconductor").

An apparatus for measuring electric characteristics of a semiconductor according to the present invention includes a light irradiating means for irradiating light to a characteristic measured semiconductor, an alternating-current voltage source, electrodes for applying an alternating-current voltage to the characteristic measured semiconductor from the alternating-current voltage source, an impedance regulator connected to the characteristic measured semiconductor in series and an electric potential measuring means for measuring electric potential at a connection point between the characteristic measured semiconductor and the impedance regulator, wherein the impedance regulator is regulated so as to have alternating-current impedance similar to that of the characteristic measured semiconductor, the alternating-current voltage being applied to the characteristic measured semiconductor in such a manner that electric potential at the connection point between the characteristic measured semiconductor and the impedance regulator may become zero electric potential.

According to the apparatus of the present invention, in the state in which light is not irradiated to the semiconductor, the measured electric potential is set to zero electric potential and the electric potential measured with irradiation of light is measured as the fluctuated electric potential from the zero electric potential so that electric characteristics of semiconductor can be measured with high accuracy.

Also, an apparatus for measuring electric characteristics of a semiconductor according to the present invention includes a light irradiating means for irradiating light to a characteristic measured semiconductor, an alternating-current voltage source, electrodes for applying an alternating-current voltage to the characteristic measured semiconductor from the alternating-current voltage source, an impedance regulator connected to the characteristic measured semiconductor in parallel and electric potential measuring means for measuring electric potential at a connection point between the characteristic measured semiconductor and the impedance regulator, wherein the impedance regulator is regulated so as to have alternating-current impedance similar to that of the characteristic measured semiconductor, the alternating-current voltage being applied to the characteristic measured semiconductor in such a manner that electric potential of at least one electrode on the characteristic measured semiconductor and electric potential of at least one electrode of the impedance regulator may become the same electric potential.

In the apparatus for measuring electric characteristics of a semiconductor according to the present invention, the characteristic measured semiconductor and the impedance regulator are connected in parallel and electric potential of the electrode of the characteristic measured semiconductor and the electrode of the impedance regulator are set to the same electric potential. That is, in the state in which light is not irradiated to the characteristic measured semiconductor, they are set to the same electric potential state. Thus, fluctuations of electric potential of the semiconductor obtained when light is irradiated to the characteristic measured semiconductor, that is, difference between electric potential obtained with irradiation of light and electric potential obtained without irradiation of light can be measured so that light-induced electric conduction can be measured with high accuracy.

Then, in the apparatus for measuring electric characteristics of a semiconductor according to the present invention, since any of the above-mentioned apparatus can measure electric characteristic of semiconductor in the interface state in which the insulating film is formed on the semiconductor, electric characteristics of semiconductor can be measured with reliability in the state in which the insulating film exists on the surface of the characteristic measured semiconductor.

Also, in the above-mentioned apparatus for measuring electric characteristic of a semiconductor, a direct-current bias voltage is applied to at least the characteristic measured semiconductor, the direct-current bias voltage being applied to the characteristic measured semiconductor in the state in which an alternating-current voltage being superimposed upon the direct-current bias voltage from the alternating-current voltage source.

When the direct-current bias voltage is applied to the characteristic measured semiconductor as described above, the applied direct-current bias voltage causes an internal electric field based on fixed electric charges within the semiconductor and the like. Therefore, it is possible to examine electric characteristics of semiconductor by checking influences exerted upon electric conduction (this electric conduction becomes a factor to change electric characteristics of a semiconductor) from this internal electric field.

Also, in the above-mentioned apparatus for measuring electric characteristic of a semiconductor, the light irradiated to the characteristic measured semiconductor is pulse light by way of example.

When pulse light is irradiated to the characteristic measured semiconductor as described above, attenuation of excess minority carriers photo-induced within the characteristic measured semiconductor, that is, life time can be measured with high accuracy and the carrier conduction mechanism such as semiconductor surface level and defect can be measured with high accuracy.

Alternatively, in the above-mentioned apparatus for measuring electric characteristic of a semiconductor, the light irradiated to the characteristic measured semiconductor is ordinary ray, that is, continuous light irradiation.

As described above, when electric characteristics of semiconductor are measured with irradiation of ordinary ray, as will be described later on, it is possible to measure electric characteristics of semiconductor by measuring the level of concentration of excess minority carriers continuously generated.

Also, in the above-mentioned apparatus of the present invention, liquid electrodes, for example, mercury (Hg) may be used as the electrodes for applying voltages to the characteristic measured semiconductor.

When the liquid electrodes are used as described above, it is possible to measure light-induced electric conduction without breaking the characteristic measured semiconductor.

BEST MODE FOR CARRYING OUT THE INVENTION

An apparatus for measuring electric characteristics of a semiconductor according to an embodiment of the present invention will be described with reference to the drawings.

Figure 1:
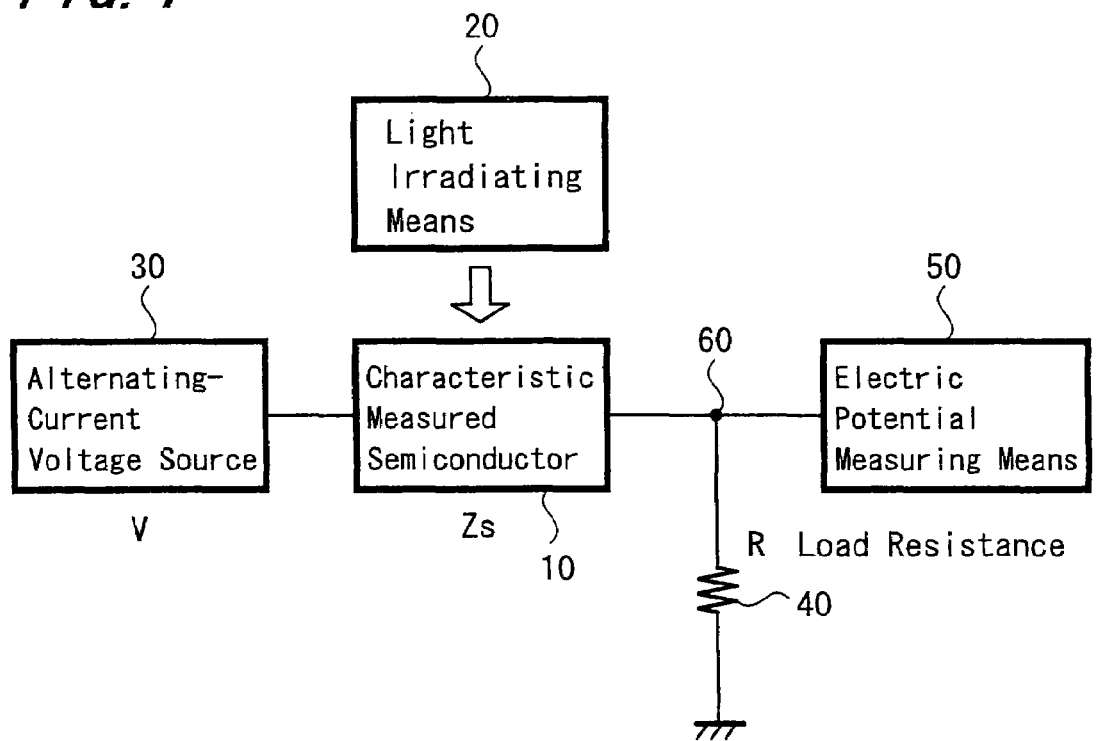
FIG. 1 is a conceptual diagram showing a fundamental arrangement of an apparatus for measuring electric characteristic of a semiconductor according to the present invention.

FIG. 1 is a conceptual diagram of a fundamental arrangement of an apparatus for measuring electric characteristics of a semiconductor according to the embodiment of the present invention. The fundamental arrangement shown in FIG. 1 includes all of the fundamental arrangement of the apparatus for measuring electric characteristics of a semiconductor according to the embodiment of the present invention. Specifically, this fundamental arrangement of the apparatus for measuring electric characteristics of a semiconductor includes a light irradiating means 20 such as a laser for irradiating light to a characteristic measured semiconductor 10 of which characteristics are to be measured, an alternating-current voltage source 30, a load resistance 40 and an electric potential measuring means 50 for measuring electric potential of the characteristic measured semiconductor 10. When electric characteristics are measured, laser light is irradiated to the characteristic measured semiconductor 10 from the light irradiating means 20.

According to this arrangement, when an alternating-current $V_0 e^{j\omega t}$ with an angular frequency of $\omega$ and an amplitude of $V_0$ is applied to the characteristic measured semiconductor 10 from the alternating-current voltage source 30, at that time, an electric current I flows in response to a complex impedance Zs ($=Z_0 e^{j\Phi 0}$) of the characteristic measured semiconductor 10 corresponding to the angular frequency ω. The current I to be measured is given by the following equation (1) due to electric potential of a load resistor R.

$$I = \frac{V_0 e^{j\omega t}}{Z_S + R} \quad (1)$$

In this state, if light is irradiated to the characteristic measured semiconductor 10 from the light irradiating means 20, then resistance of the characteristic measured semiconductor is lowered by the thus induced minority carrier and hence the impedance of the characteristic measured semiconductor is changed to Zs'. Accordingly, the electric current I may be given by the following equation (2):

$$I' = \frac{V_0 e^{j\omega T}}{Z'_S + R} \quad (2)$$

From a difference between electric current values, expressed by the equations (1) and (2), obtained before and after light is irradiated to the characteristic measured semiconductor, it is possible to know light induced electric conduction characteristic of the characteristic measured semiconductor 10.

If the characteristic measured semiconductor 10 is a resistor covered with an insulating film, then when the complex impedance Zs of the characteristic measured semiconductor 10 is expressed by using a capacity Cs of the insulating film and a resistance component Rs, the complex impedance Zs is given by the following equation. (3). It is to be noted that reference symbol ω represents an angular frequency of the alternating-current voltage source.

$$Z_S = R_S + \frac{1}{jC\omega} \quad (3)$$

Then, when light is irradiated to the characteristic measured semiconductor 10, the resistance Rs of the characteristic measured semiconductor 10 is changed to resistance R's and impedance is given by the following equation (4):

$$Z'_S = R'_S + \frac{1}{jC\omega} \quad (4)$$

Accordingly, it is possible to know the manner in which the resistance component of the characteristic measured semiconductor 10 is changed with irradiation of light, that is, the change of the resistance component from the resistance Rs to the resistance R's by measuring the electric currents I and I' shown on the equations (1) and (2).

In the circuit arrangement shown in FIG. 1, when light pulse is used as the light irradiating means 20, it is possible to check electric characteristics of the character measured semiconductor 10 by measuring the manner in which electric conduction is changed with time by light induced carriers.

This point will be described below in detail.

In the circuit arrangement described with reference to FIG. 1, an N type silicon substrate covered with a thermally oxidized insulating film with a thickness of 100 nm is used as the characteristic measured semiconductor 10 and XeCl excimer laser pulse light (wavelength of 308 nm and pulse width of 30 ns) is irradiated to the above silicon substrate. Then, an alternating-current voltage of 1 MHz is supplied to the characteristic measured semiconductor 10 from the alternating-current voltage source 30. The manner in which electric potential at a connection point 60 is changed with time was measured by the electric potential measuring means 50 while a voltage applied to the load resistance R at that time, that is, electric potential of this connection point 60 is used as the electric potential measuring point.

Figure 2:
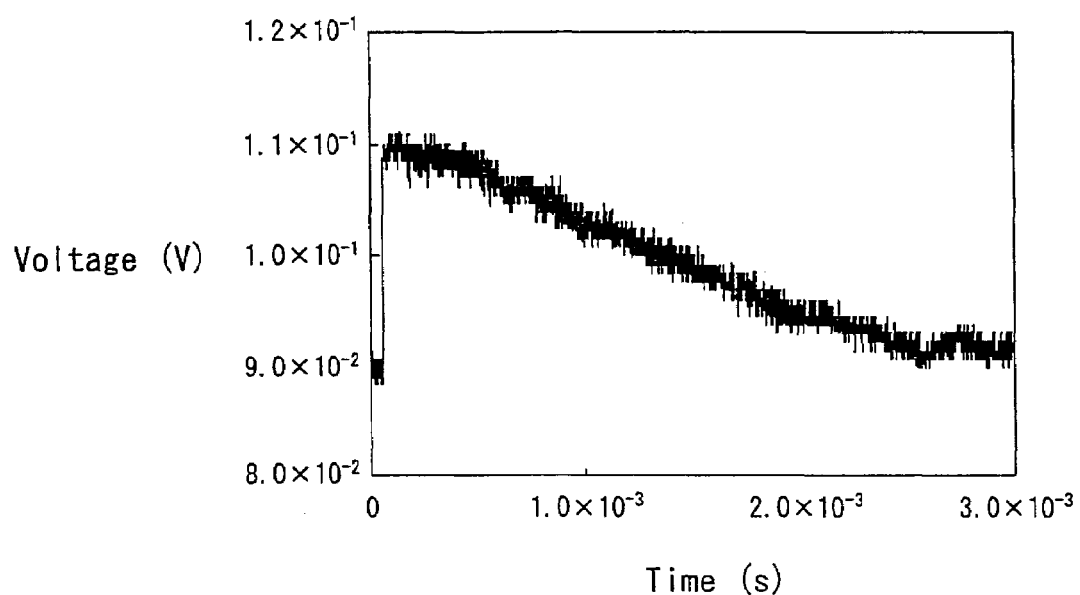
FIG. 2 is a graph showing measured results of an alternating-current voltage changed with time at an electric potential measuring point in FIG. 1.

As is clear from FIG. 2, pulse light is irradiated to the characteristic measured semiconductor at time point in which time is zero on the horizontal axis with the result that the amplitude of the voltage is increased. This demonstrates that resistance of the sample (characteristic measured semiconductor 10) was decreased at the moment induced carriers are generated with irradiation of pulse laser light. The voltage that was raised temporarily is decreased with time and converged to a predetermined value.

Also, although this characteristic measured semiconductor 10 is covered with the thermally oxidized insulating film, it is possible to examine the change of carriers in the characteristic measured semiconductor 10 with application of a displacement electric current of an alternating-current.

In the example of the measurement shown in FIG. 2, light induced conduction generated with irradiation of the above-mentioned one pulse could be observed over a time period of 2.5 ms. This demonstrates that excess carriers generated with irradiation of light exits in silicon for a long period of time and hence it is to be understood that the characteristic measured semiconductor 10 to be measured in this time is a characteristic measured semiconductor having an interface of excellent quality with small carriers to be captured, that is, a bulk characteristic with small surface level density and small carrier capture defect.

Next, embodiments of the present invention will be described but it is needless to say that the present invention is not limited to these embodiments.

Embodiment 1

Figure 3:
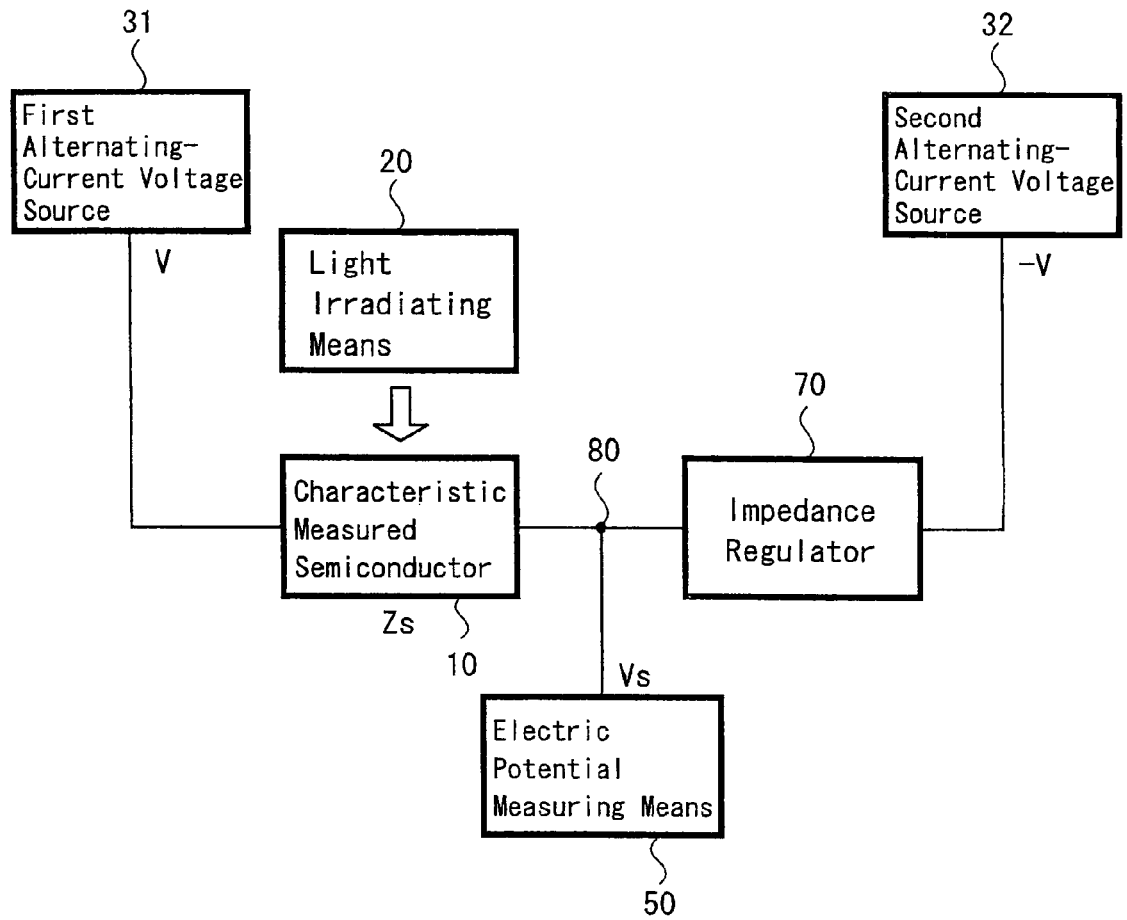
FIG. 3 is a block diagram showing an apparatus for measuring electric characteristic of a semiconductor according to an embodiment of the present invention.

FIG. 3 is a block diagram showing an arrangement of an apparatus for measuring electric characteristics of a semiconductor according to the embodiment of the present invention. Although this apparatus according to the present invention has a fundamental arrangement shown in FIG. 1, it has an arrangement capable of more precisely measuring light-induced electric conduction.

As shown in FIG. 3, in this inventive example, instead of the load resistance 40 (R) in FIG. 1, an impedance regulator 70 composed of a variable capacitor and a variable resistor is connected in series to the characteristic measured semiconductor 10.

Also, in this case, first and second alternating-current voltage sources 31 and 32 are used as alternating-current voltage sources. An alternating-current voltage V is applied to the characteristic measured semiconductor 10 from the first alternating-current voltage source 31 and an alternating-current voltage −V with the same amplitude as that of the alternating-current voltage V from the first alternating-current voltage source 31 and of which phase is shifted 180 degrees is applied to the impedance regulator 70 from the second alternating-current voltage source 32.

Then, in this circuit arrangement, when impedance of the impedance regulator 70 is selected to be the same value Zs of the impedance of the characteristic measured semiconductor 10 in the state in which light is not irradiated to the characteristic measured semiconductor from the light irradiating means 20, an electric current flowing at that time is given by the following equation (5):

$$I = \frac{V-(-V)}{Z_S+Z_S} = \frac{V}{Z_S} = \frac{V_0 e^{j\omega t}}{Z_S} \tag{5}$$

In this state, when electric potential Vs at the connection point 80 between the characteristic measured semiconductor 10 and the impedance regulator is calculated, the electric potential becomes zero as shown by the following equation (6):

$$V_s = v - I^* Z_s = v - v = 0 \tag{6}$$

When light is irradiated to the characteristic measured semiconductor 10 in the state in which the electric potential Vs of the connection point 80 is zero, the impedance of the characteristic measured semiconductor 10 is changed from Zs to Zs' in response to the manner in which electric conduction is changed by light-induced carriers. Then, since the electric potential Vs at the connection point 80 in the above-described equation (6) is changed from zero to predetermined electric potential, an electric current flowing at that time is given by the following equation (7):

$$I = \frac{V-(-V)}{Z'_S+Z_S} = \frac{2V}{Z'_S+Z_S} \tag{7}$$

Accordingly, the electric potential Vs at the connection point 80 may be given by the following equation (8):

$$V_S = V - I \times Z'_S = \frac{Z_S - Z'_S}{Z_S + Z'_S} V \tag{8}$$

Then, if the impedance Zs, which was changed due to light-induced electric conduction, of the characteristic measured semiconductor 10 is expressed by the following equation (9) where ΔZs represents the changed amount of impedance.

$$Z'_S = Z_S - \Delta Z_S \tag{9}$$

$$\Delta Z_S = \frac{2V_S}{V+V_S} Z_S \tag{10}$$

If the electric potential Zs at the connection point 80 is set to zero electric potential by the impedance regulator 70 and the impedance Zs of the characteristic measured semiconductor is calculated in advance as described above, then the impedance changed amount ΔZs changed by the light-induced carriers can be obtained. It is to be noted that, since molecules are held at only the electric potential Vs, the degree in which the impedance of the characteristic measured semiconductor 10 is changed with irradiation of light can be calculated extremely accurately by the above-described equation (10).

In this case, when a pulse light source is used as the light source, that is, the light irradiating means 20, light-induced carrier density is changed with time. If the degree in which the electric potential Vs at the connection point 80 is changed due to the change of the light-induced carrier density is calculated, then the change of the impedance can be calculated with high accuracy as shown by the following equation (11).

$$\Delta Z_S(t) = \frac{2V_S(t)}{V+V_S(t)} Z_S \tag{11}$$

When the impedance of the characteristic measured semiconductor 10 is given by the equation (3), since Rs>>1/ωC is established, the change of the impedance of the characteristic measured semiconductor 10 becomes the change of the resistance component Rs shown in the following equation (12):

$$\Delta Z_s(t) = \Delta R_s(t) \tag{12}$$

Here, W assumes an effective width of a resistor, L assumes a length of the resistor, μ assumes mobility of carrier, e assumes electric quantum and n assumes carrier concentration. Then, the resistance Rs of the characteristic measured semiconductor 10 is given by the following equation (13):

$$R_S = \frac{L}{We\mu n} \tag{13}$$

Then, when the carrier concentration is increased Δn with irradiation of light to the characteristic measured semiconductor, the changed resistance R's is expressed by the following equation (14) so that the impedance changed amount on the equation (13) may be given by the equation (15).

$$R'_s = \frac{L}{We\mu(n+\Delta n)} \tag{14}$$

$$\Delta n = \frac{\Delta R_s}{R_s - \Delta R_s} n = \frac{\Delta Z}{R_s - \Delta Z} n \tag{15}$$

As a result, the change of the carrier concentration is given by using the change of the impedance based on the following equation (16):

$$\Delta n = \frac{\Delta R_s}{R_s - \Delta R_s} n = \frac{\Delta Z}{R_s - \Delta Z} n \tag{16}$$

If impedance matching is carried out in advance and the resistance component of the characteristic measured semiconductor 10 is detected, then the impedance changed amount can be detected from the measured result of the electric potential Vs at the connection point 80 by using the equation (11) and it is possible to detect the change of the carrier concentration based on the equation (16).

Next, inventive examples in which electric characteristics of semiconductor were measured by the inventive apparatus based on this embodiment 1 will be described.

INVENTIVE EXAMPLE 1

Characteristics of the characteristic measured semiconductor 10 including the N type silicon substrate covered with the 160 nm-thick thermally oxidized insulating film according to the embodiment 1 of the present invention shown in FIG. 3 were measured. In this case, XeCl excimer laser pulse light (wavelength of 308 nm and pulse width of 30 ns) was irradiated to the characteristic measured semiconductor at the energy of 1.2 mJ/cm².

Figure 4:
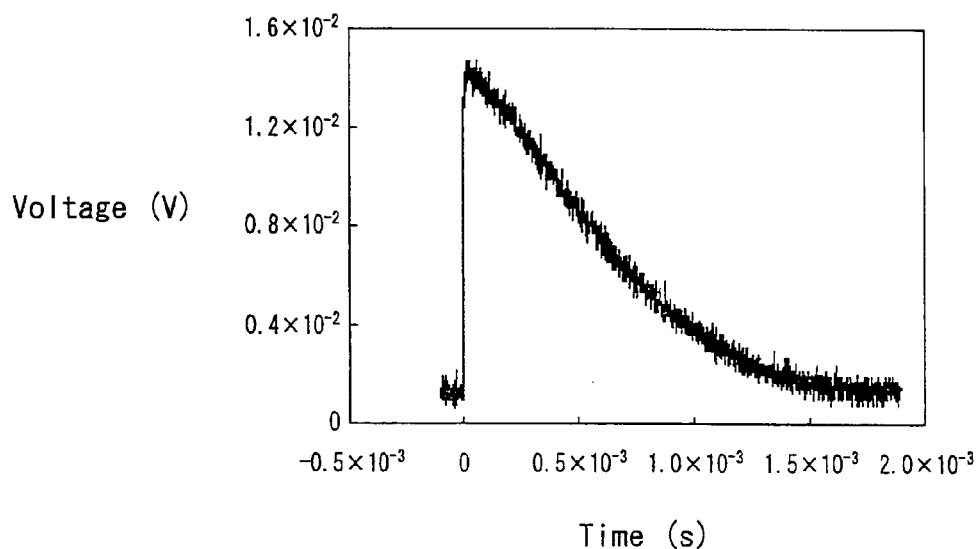
FIG. 4 is a graph showing measured results obtained when electric potential Vs was changed at the electric potential point with time in the state in which pulse light is irradiated on the semiconductor.

FIG. 4 is a diagram showing measured results of a degree in which the electric potential Vs is changed with time wherein the connection point between the impedance regulator 70 and the characteristic measured semiconductor 10 is set to the electric potential measuring point 80.

With application of a voltage of a frequency of 1 MHz with amplitude of 0.1V, the electric potential Vs could be decreased to 0.001V by impedance matching.

As shown in FIG. 4, when pulse laser light is irradiated to the characteristic measured semiconductor at a time zero second, the electric potential Vs could be increased due to the occurrence of light-induced carriers. After irradiation of pulse light, the electric potential Vs was gradually decreased with time and returned to the initial value at a time of 1.5 ms. As a result, it is to be understood that light-induced excessive carriers exist in the silicon only during the time of 1.5 ms.

INVENTIVE EXAMPLE 2

Characteristics of the characteristic measured semiconductor 10 including the N type silicon substrate covered with a 100 nm-thick TEOS (Tetra Ethyl Ortho Silicate) plasma CVD silicon oxide film by the embodiment 1 of the present invention shown in FIG. 3 were measured. In this case, XeCl excimer laser pulse light (wavelength of 308 nm and amplitude of 30 ns) was irradiated to the characteristic measured semiconductor from the light irradiating means 20 at the energy of 23 µJ/cm².

Figure 5:
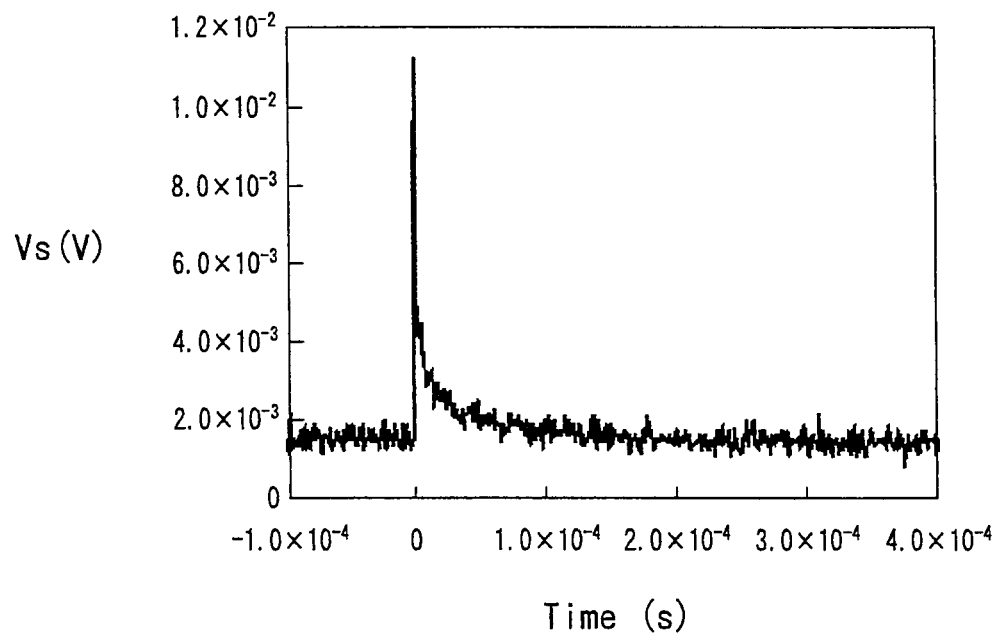
FIG. 5 is a graph showing the manner in which the electric potential Vs was changed with time when characteristics of a characteristic measured semiconductor having an N type silicon substrate covered with a silicon oxide film were measured by the apparatus according to the present invention.
Figure 6:
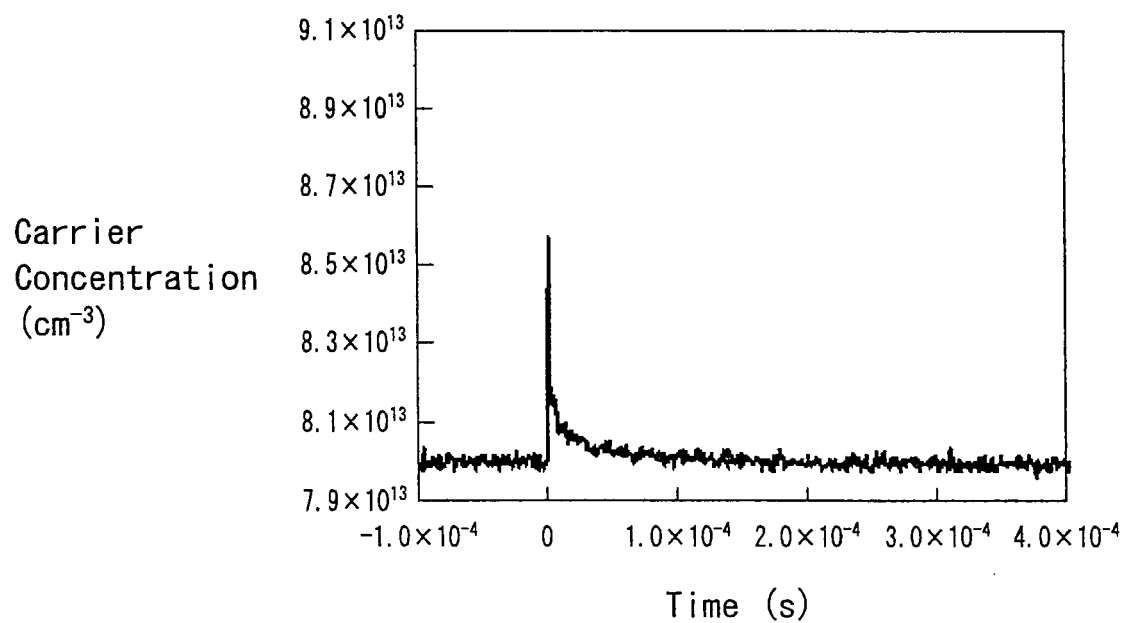
FIG. 6 is a graph showing measured results obtained when the change of the carrier concentration with time in FIG. 5 was calculated.

FIG. 5 is a diagram showing measured results of the electric potential Vs changed with time. As is clear from FIG. 5, although the electric potential Vs at the connection point 80 was rapidly increased due to the occurrence of light-induced carriers with irradiation of laser light to the characteristic measured semiconductor, the amplitude was decreased rapidly later on and attenuated to $1/10$ after 26 µs. This may demonstrate that carrier capture defects are large in the silicon oxide film and the silicon interface so that the thus generated light carrier concentration was attenuated quickly. FIG. 6 is a diagram showing results of quantity in which the carrier concentration was changed with time by using the equation (16) from the measured results shown in FIG. 5. As is clear from FIG. 6, light-induced carriers of $8.6 \times 10^{13}$ cm$^{-2}$ were generated when light is irradiated to the characteristic measured semiconductor. Then, light-induced carriers were attenuated to $1/10$ after 26 µs.

As described above, according to the apparatus of the present invention, it is possible to measure generation of carriers with extremely small concentration and quick attenuation of carriers with time.

INVENTIVE EXAMPLE 3

Next, a semiconductor sample with the same arrangement as that of the inventive example 2 was used as the characteristic measured semiconductor 10 and this semiconductor sample was heat-treated at 260° C. for three hours at the steam atmosphere of $1.3 \times 10^6$ Pa.

Figure 7:
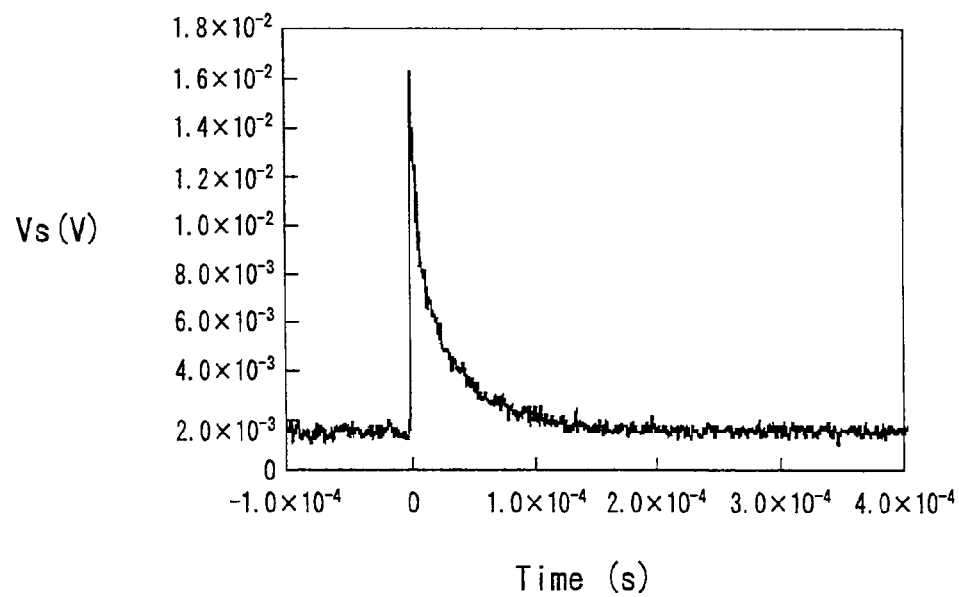
FIG. 7 is a graph showing the manner in which measured electric potential Vs obtained after heat treatment was changed with time.

FIG. 7 is a diagram showing measured results of the electric potential Vs changed with time when XeCl excimer laser (wavelength of 308 nm and pulse width of 30 ns) was irradiated to the characteristic measured semiconductor from the light irradiating means 20 of the apparatus of the present invention shown in FIG. 3. In this case, electric potential Vs of a relatively long time was observed with laser irradiation. This may exhibit the fact that carrier capture defects on the silicon oxide film and the silicon interface could be decreased by the heat treatment with the result that light-induced carriers existed during a long period of time.

Figure 8:
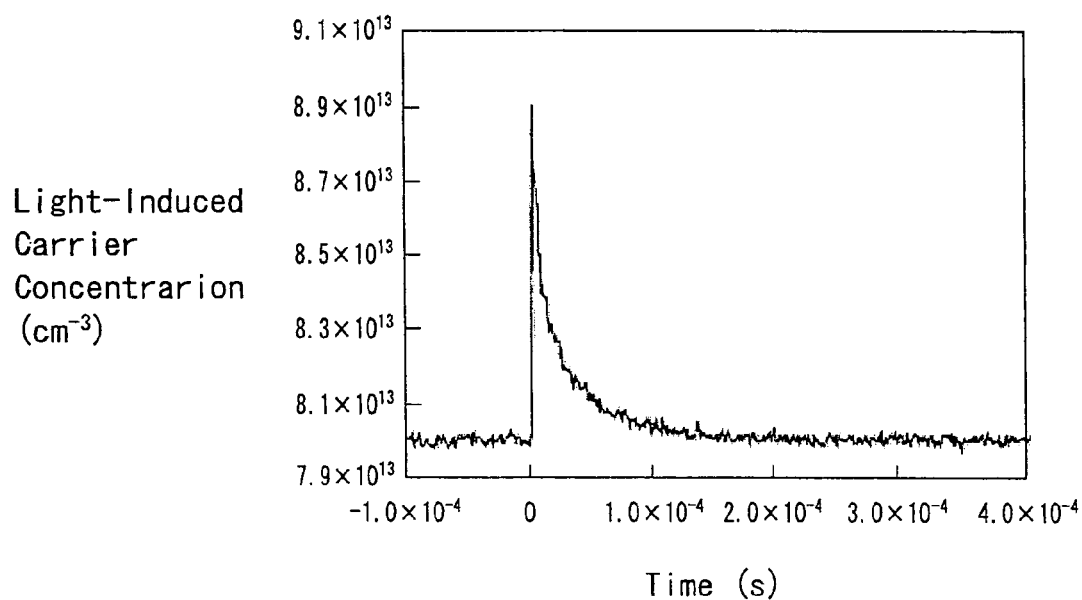
FIG. 8 is a graph showing measured results obtained when the change of the carrier concentration with time in FIG. 5 was calculated.

Also, FIG. 8 is a diagram showing measured results of a carrier concentration changed with time. According to this diagram, it was observed that laser-induced carriers with density as high as $8.9 \times 10^{13}$ cm$^{-2}$ were generated from the characteristic measured semiconductor 10 by the heat treatment for three hours at 260° C. in the steam atmosphere. Then, it became clear that a time during which the laser-induced carriers are decreased to $1/10$ is 80 µs.

In this manner, according to the present invention, it is possible to examine electric conduction characteristics of the sample in detail.

Embodiment 2

Next, other embodiment of the apparatus according to the present invention will be described.

Figure 9:
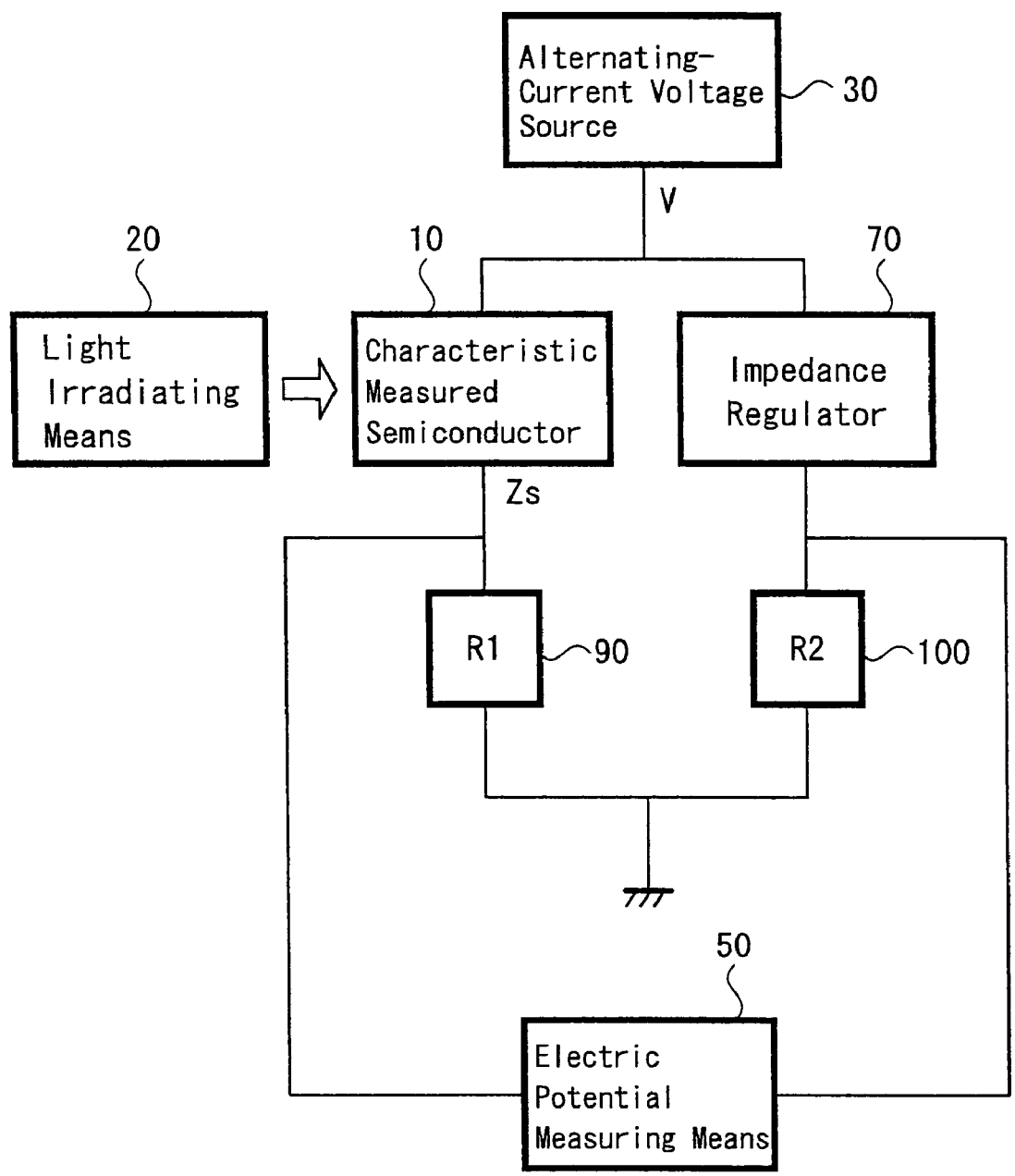
FIG. 9 is a block diagram showing the apparatus according to another embodiment of the present invention.

FIG. 9 is a block diagram showing a circuit arrangement of a second embodiment according to the present invention. In FIG. 9, parts corresponding to those of FIG. 3 are denoted by identical reference numerals. In this second embodiment, the characteristic measured semiconductor 10 and the impedance regulator 70 are located in parallel to each other and a bridge circuit is formed by using two resistances (R1) 90 and (R2) 100.

In this circuit arrangement, similarly to the aforementioned examples, impedance matching may be established in the state in which light is not irradiated to the characteristic measured semiconductor from the light irradiating means 20 without application of the alternating-current voltage from the alternating-current voltage source 30. As a consequence, electric potential drops of the characteristic measured semiconductor 10 and the impedance regulator 70 were selected to be the same, that is, they are held at the same electric potential and the output from the electric potential measuring means 50 is set to zero.

In this state, similarly to the aforementioned first embodiment, when light is irradiated to the characteristic measured semiconductor 10 from the light irradiating means 20, excessive minority carriers are generated in the characteristic measured semiconductor and balance of the electric potential drops of the characteristic measured semiconductor 10 and the impedance regulator 70 is lost by corresponding resistance change and corresponding output is obtained from the electric potential measuring means 50.

Therefore, according to the apparatus having this arrangement of the present invention, it is possible to accurately measure light-induced electric conduction characteristic caused by carriers within the semiconductor.

Embodiment 3

This embodiment relates to an apparatus for measuring electric characteristics of a characteristic measured semiconductor in which influences exerted by capacitance produced when a depletion layer is generated by internal electric field of semiconductor may not be negligible.

In this case, capacity of the depletion layer is adjusted by superimposing a direct-current bias voltage upon the alternating-current voltage relative to at least the characteristic measured semiconductor 10. When this embodiment is applied to the arrangement shown in FIG. 9, for example, the apparatus according to the present invention has an arrangement in which its alternating-current voltage source 30 is an alternating-current voltage source superimposed upon the direct-current bias voltage.

Embodiment 4

Also, in the apparatus according to the present invention, similarly to the above-mentioned embodiments, although it is possible to accurately measure light-induced electric conduction characteristic by measuring attenuation of excessive minority carriers generated by optical excitation of pulse light, that is, instantaneous optical excitation, the present invention is not limited to the above-mentioned excitation of pulse light but it is possible to evaluate electric characteristics of the semiconductor by irradiating ordinary rays of light, that is, continuous light with constant intensity to the characteristic measured semiconductor.

This fourth embodiment relates to the case in which ordinary rays of light are irradiated to the characteristic measured semiconductor.

In this case, in the embodiment 1 shown in FIG. 3, for example, a lamp is used as the light irradiating means 20 to generate ordinary rays of light to irradiate the characteristic measured semiconductor 10.

At that time, impedance of the characteristic measured semiconductor 10 is matched by the impedance regulator 70 and electric potential at the connection point, that is, the electric potential measuring point is set to zero before ordinary rays of light are irradiated to the characteristic measured semiconductor.

In this state, ordinary rays of light are irradiated onto the characteristic measured semiconductor and ordinary rays of light are absorbed to generate excessive minority carriers on the characteristic measured semiconductor 10.

Also in this case, when semiconductor/insulator interface characteristics are poor and life of carriers is short, generated carriers are immediately ceased to exist so that carrier concentration obtained under irradiation of ordinary rays of light is low and that decrease of resistance of the semiconductor sample is small. As a result, a degree in which electric potential at the electric potential measuring point 80 is changed with irradiation of light is decreased. On the other hand, when the semiconductor/insulator interface characteristics are satisfactory and life of carriers is long, generated carriers are extended in life, carrier concentration obtained under irradiation of ordinary rays of light is increased and resistance of the semiconductor sample is lowered considerably. As a result, a degree in which electric potential at the electric potential measuring point 80 is changed with irradiation of light is increased. It is possible to examine electric characteristics of the semiconductor samples based on these properties by using ordinary rays of light.

INVENTIVE EXAMPLE 4

Next, an embodiment in this inventive example 4 will be described. In this inventive example, the characteristic measured semiconductor 10 had a 100 nm-thick N type silicon substrate covered with a TEOS plasma CVD silicon oxide film. This characteristic measured semiconductor was treated in heat for three hours at 260° C. in the $1.3 \times 10^6$ Pa steam atmosphere and ordinary ray of light was irradiated to the characteristic measured semiconductor 10 from a 5 mW lamp of the light irradiating means 20 before and after heat treatment.

Figure 10:
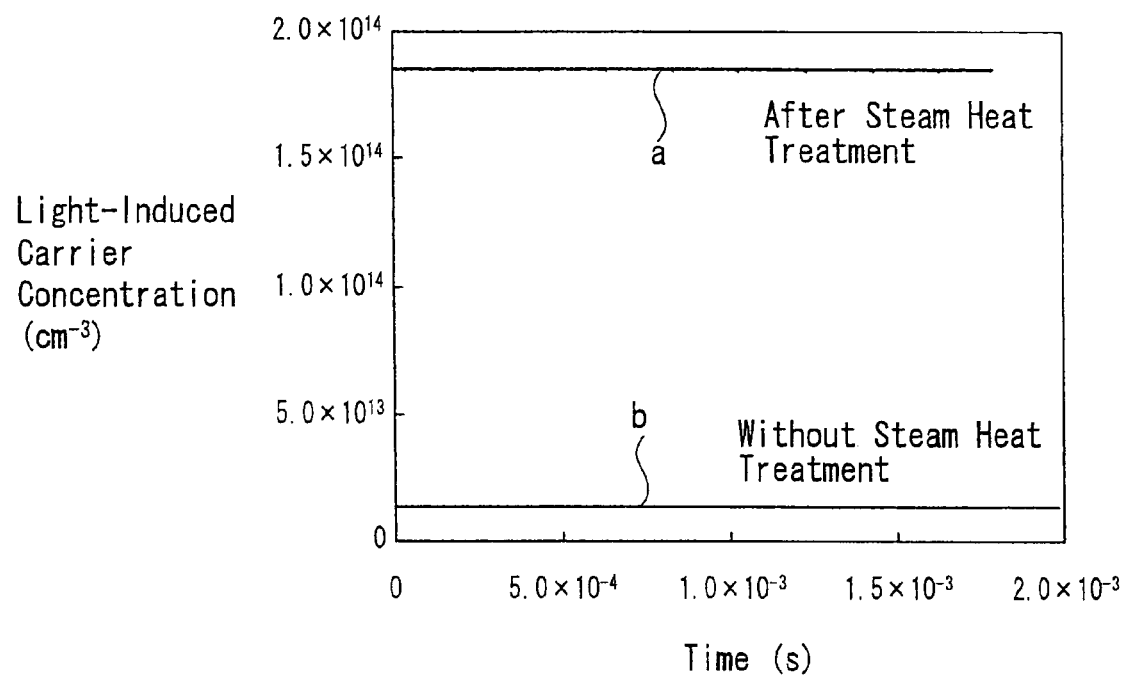
FIG. 10 is a graph showing measured results of light-induced carrier concentration obtained when ordinary ray of light was irradiated to the characteristic measured semiconductor in the embodiment of the apparatus according to the present invention.

FIG. 10 shows measured results of concentrations of light-induced carriers generated with irradiation of light after and before the heat treatment in the above-mentioned steam atmosphere (steam heat treatment).

As shown in FIG. 10, since the life time of the light-induced carriers was short as shown by a level b before the steam heat treatment, the carrier concentration was $1.3 \times 10^{13}$ $cm^{-3}$, after the steam heat treatment, the carrier concentration was increased to $1.85 \times 10^{14}$ $cm^{-3}$ as shown by a level a.

As described above, according to the irradiation of ordinary rays of light, it is possible to examine electric conduction characteristics of the characteristic measured semiconductor 10 in detail.

Figure 11:
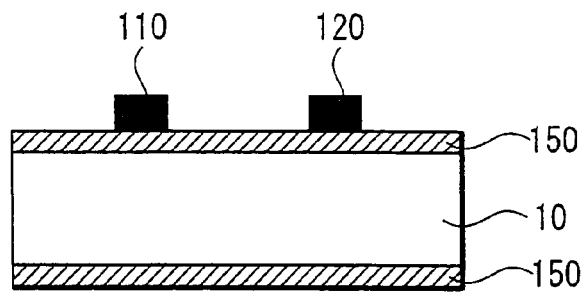
FIG. 11 is a schematic cross-sectional view of an example of a characteristic measured semiconductor of which characteristics are to be measured by the apparatus according to the present invention.

Also, FIG. 11 is a schematic cross-sectional view of an example of a characteristic measured semiconductor. A voltage can be applied to the characteristic measured semiconductor 10 by locating two electrodes 110 and 120 on an insulating film 150 formed on the characteristic measured semiconductor 10. The electrodes can be formed by a sputtering method or by forming a metal film based on vacuum deposition or other suitable methods such as plating.

Figure 12:
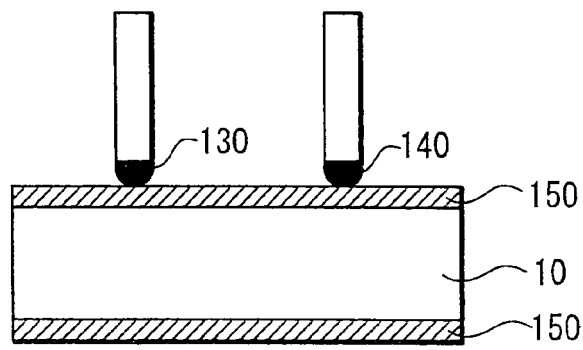
FIG. 12 is a schematic cross-sectional view of another example of a characteristic measured semiconductor of which characteristics are to be measured by the apparatus according to the present invention.

Also, FIG. 12 is a schematic cross-sectional view of an example of a characteristic measured semiconductor 10 in which light-induced electric conduction is to be measured by the apparatus according to the present invention. In this example, the apparatus according to the present invention uses liquid-metal electrodes with large surface tension, for example, electrodes 130 and 140 made of mercury.

According to this arrangement, since metal such as mercury with large surface tension is brought in contact with the insulating film, in the above-mentioned measurement, it is possible to easily apply the voltage to the characteristic measured semiconductor 10.

As described above, according to the apparatus for measuring electric characteristics of semiconductor of the present invention, it is possible to measure electric characteristics by a simple arrangement with high accuracy. Then, in the characteristic measured semiconductor to be measured, even when the insulating film is formed on the surface of the semiconductor, it is possible to measure and evaluate light-induced electric conduction accurately without removing the insulating film.

It should be noted that the present invention may not be of course limited to the above-mentioned examples.

The invention claimed is:

1. An apparatus for measuring electric characteristic of a semiconductor comprising:

light irradiating means for irradiating light to a characteristic measured semiconductor;

an alternating-current voltage source;

electrodes for applying an alternating-current voltage to said characteristic measured semiconductor from said alternating-current voltage source;

an impedance regulator connected to said characteristic measured semiconductor in series; and electric potential measuring means for measuring electric potential at a connection point between said characteristic measured semiconductor and said impedance regulator, wherein said impedance regulator is regulated so as to have alternating-current impedance similar to that of said characteristic measured semiconductor, said alternating-current voltage being applied to said characteristic measured semiconductor in such a manner that electric potential at said connection point between said characteristic measured semiconductor and said impedance regulator may become zero electric potential, and wherein at least said characteristic measured semiconductor is applied with a direct-current bias voltage, said direct-current bias voltage being applied to said characteristic measured semiconductor in the state in which said alternating-current voltage is superimposed upon said direct-current bias voltage from said alternating-current voltage source.

2. An apparatus for measuring electric characteristic of a semiconductor according to claim 1, wherein said light irradiated to said characteristic measured semiconductor is pulse light.

3. An apparatus for measuring electric characteristic of a semiconductor according to claim 1, wherein said light irradiated to said characteristic measured semiconductor is ordinary ray.

4. An apparatus for measuring electric characteristic of a semiconductor according to claim 1, wherein said electrodes are liquid-metal electrodes.

* * * * *